United States Patent
Seddon (10) Patent No.: US 11,069,585 B2
(45) Date of Patent: *Jul. 20, 2021

(54) SEMICONDUCTOR SUBSTRATE CRACK MITIGATION SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/784,687

(22) Filed: Feb. 7, 2020

(65) Prior Publication Data
US 2020/0176336 A1 Jun. 4, 2020

Related U.S. Application Data (63) Continuation of application No. 15/964,484, filed on Apr. 27, 2018, now Pat. No. 10,593,602.

(51) Int. Cl.
| | |
|---|---|
| *H01L 21/66* | (2006.01) |
| *H01L 21/263* | (2006.01) |
| *H01L 23/00* | (2006.01) |

(52) U.S. Cl.
CPC .......... *H01L 22/22* (2013.01); *H01L 21/2636* (2013.01); *H01L 23/564* (2013.01)

(58) Field of Classification Search
CPC ... H01L 22/22; H01L 21/2636; H01L 23/564; H01L 23/562; H01L 23/544; H01L 2223/54433; H01L 22/12; H01L 21/0201; H01L 21/02032; H01L 21/3245; H01L 29/1608; H01L 29/06; H01L 21/02002–02035; H01L 21/02013; H01L 21/02024; H01L 21/2633; H01L 21/304–3046; H01L 21/32131–32132; H01L 21/463; H01L 21/4842; H01L 21/4878; H01L 21/4896; H01L 51/0016; H01L 21/0272; H01L 21/0331; H01L 21/7813; H01L 2224/0347–0348; H01L 2224/1147–1148; H01L 2224/2747–2748; H01L 21/322–3228
USPC ........................................................... 438/4
See application file for complete search history.

(56) References Cited

U.S. PATENT DOCUMENTS

| | | | |
|---|---|---|---|
| 4,218,418 A | 8/1980 | Schmid et al. | |
| 2004/0101981 A1 | 5/2004 | Morishita | |
| 2005/0056056 A1 | 3/2005 | Wong | |
| 2010/0044857 A1 | 2/2010 | Shao et al. | |
| 2011/0224819 A1* | 9/2011 | Kang | G05B 19/41875 700/108 |
| 2013/0086784 A1 | 4/2013 | Bunker | |
| 2013/0183791 A1 | 7/2013 | Nakayama et al. | |

(Continued)

FOREIGN PATENT DOCUMENTS

| | | |
|---|---|---|
| CN | 106544671 A | 3/2017 |

*Primary Examiner* — Mohammad M Hoque
(74) *Attorney, Agent, or Firm* — Adam R. Stephenson, Ltd.

(57) ABSTRACT

Implementations of a method for healing a crack in a semiconductor substrate may include identifying a crack in a semiconductor substrate and heating an area of the semiconductor substrate including the crack until the crack is healed.

20 Claims, 3 Drawing Sheets

(56) References Cited

U.S. PATENT DOCUMENTS

2016/0231256 A1* 8/2016 Kojima ................ C30B 23/00
2018/0133928 A1* 5/2018 Jang ..................... B26D 7/27
2020/0381262 A1* 12/2020 Trojan .............. H01J 37/32825

* cited by examiner

SEMICONDUCTOR SUBSTRATE CRACK MITIGATION SYSTEMS AND RELATED METHODS

CROSS REFERENCE TO RELATED APPLICATIONS

This application is a continuation application of the earlier U.S. Utility patent application to Michael J. Seddon entitled "Semiconductor Substrate Crack Mitigation Systems and Related Methods," application Ser. No. 15/964,484, filed Apr. 27, 2018, now pending, the disclosure of which is hereby incorporated entirely herein by reference.

BACKGROUND

1. Technical Field

Aspects of this document relate generally to crack mitigation systems and methods for semiconductor substrates and boules.

2. Background

Semiconductor substrates are often generated using a bulk structure, often a single crystal bulk structure. Silicon substrates are generally formed through producing a boule, or cylindrical ingot of the crystalline structure, which is later sliced into a plurality of semiconductor substrates. The semiconductor substrates may be singulated to form a plurality of semiconductor devices.

SUMMARY

Implementations of a method for healing a crack in a semiconductor substrate may include identifying a crack in a semiconductor substrate and heating an area of the semiconductor substrate including the crack until the crack is healed.

Implementations of a method for healing a crack in a semiconductor substrate may include one, all, or any of the following:

The semiconductor substrate may include silicon carbide.

The method may include electronically identifying the heated area of the semiconductor substrate, processing the semiconductor substrate, and forming a plurality of semiconductor die from a portion of the semiconductor substrate while excluding semiconductor die from the heated area of the semiconductor substrate from further functional use.

The method may include forming a same crystal orientation of the heated area of the semiconductor substrate as a remainder of the semiconductor substrate through either controlled cooling, controlled heating, or controlled heating and controlled cooling of the heated area of the semiconductor substrate.

The method may include forming a different crystal orientation of the heated area of the semiconductor substrate as a remainder of the semiconductor substrate through either controlled cooling, controlled heating, or controlled heating and controlled cooling of the heated area of the semiconductor substrate.

A laser may be used to heat an area of the semiconductor substrate.

The method may include electronically identifying the area of the semiconductor substrate including the crack and only heating substantially the area of the semiconductor substrate electronically identified.

Implementations of a method for mitigating propagation of a crack in a semiconductor substrate may include identifying a crack in a semiconductor substrate, removing a portion of the semiconductor substrate including the crack, coupling the semiconductor substrate to a carrier substrate, completing the processing of the semiconductor substrate while coupled to the carrier substrate, and forming a plurality of semiconductor die therefrom.

Implementations of a method for mitigating propagation of a crack in a semiconductor substrate may include one, all, or any of the following:

The semiconductor substrate may include silicon carbide.

Removing a portion of the semiconductor substrate may include etching the portion of the semiconductor substrate.

Removing a portion of the semiconductor substrate may include polishing a sidewall of the semiconductor substrate.

The method may include electronically identifying the removed portion of the semiconductor substrate, processing the semiconductor substrate, and forming a plurality of semiconductor die from a portion of the semiconductor substrate excluding the removed portion of the semiconductor substrate.

Implementations for healing a crack in a boule may include identifying a crack in a boule and heating an area of the boule including the crack until the crack is healed.

The boule may include silicon carbide.

The method may include electronically identifying the heated area of the boule, processing of the boule, and forming a plurality of semiconductor substrates from the boule.

The method may include forming a same crystal orientation of the heated area of the boule as a remainder of the semiconductor substrate through either controlled cooling, controlled heating, or controlled cooling and controlled heating of the heated area of the boule.

The method may include forming a different crystal orientation of the heated area of the boule as a remainder of the semiconductor substrate through either controlled cooling, controlled heating, or controlled heating and controlled cooling of the heated area of the boule.

A laser may be used to heat an area of the boule.

The method may include electronically identifying the area of the boule including the crack and only heating the area of the boule electronically identified.

A method for identifying damaged semiconductor die may include identifying an area including a crack in either a boule or a semiconductor substrate, electronically marking the area, and processing either the boule or the semiconductor substrate into a plurality of semiconductor die while excluding semiconductor die from the marked area of either the boule or the semiconductor substrate from further processing following singulation of the plurality of semiconductor die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor substrates and boules will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor substrates and boules, and implementing components and methods, consistent with the intended operation and methods.

A wide variety of semiconductor substrate and boule types exist and are used in the process of manufacturing various semiconductor devices. Non-limiting examples of semiconductor substrates and boules that may be processed using the principles disclosed in this document include single crystal silicon, silicon dioxide, glass, silicon-on-insulator, gallium arsenide, sapphire, ruby, silicon carbide, polycrystalline or amorphous forms of any of the foregoing, and any other substrate or boule type useful for constructing semiconductor devices. Particular implementations disclosed herein may utilize silicon carbide (SiC) semiconductor substrates and boules (silicon carbide substrates and boules), including any polytype of SiC. There are over 250 different polytypes of SiC including the 3C—SiC, 4H—SiC, and 6H—SiC polytypes, any of which may be used in various implementations disclosed in this document. In this document the term "semiconductor substrate" is also used along with "substrate" as a semiconductor substrate is a common type of substrate, but not as an exclusive term that is used to refer to all semiconductor substrate types. The various semiconductor substrate types disclosed in this document may be, by non-limiting example, round, rounded, square, rectangular, or any other closed shape in various implementations.

The methods and systems disclosed herein relate to healing cracks and/or damage in semiconductor substrates and boules. As used herein, the term "healing" can refer to eliminating a crack and/or otherwise mitigating the risk of the crack or damage propagating through further processing of either the boule or the semiconductor substrate.

Semiconductor substrates used in the manufacture of semiconductor devices are formed from a bulk structure, often a single crystal bulk structure. Semiconductor substrates are generally formed through producing a boule, or cylindrical ingot of the crystalline structure, which is later sliced into a plurality of semiconductor substrates. In various implementations, in order to be utilized in the manufacture of semiconductor devices, the semiconductor substrates need to be free of defects. If a defect, such as a crack, is found in a semiconductor substrate, because the crack may propagate and cause damage to the devices and/or break the substrate, the substrate us generally discarded immediately when the crack is discovered. Such cracking defects in semiconductor substrates may originate in the boule. Impacts to the boule, resulting from, by non-limiting example, dropping the boule, hitting the boule with an object, bumping the boule against a table, problems during growing of the boule, or other rough handling of the boule, may result in a crack or other fracture to be formed in the boule. When the boule is sliced into semiconductor substrates, the crack in the boule can result in a certain number of cracked semiconductor substrates as far as the induced defect in the boule extends along and/or into the boule. Crack defects in the boule may result in numerous semiconductor substrates being cracked as the crack in the boule will span more than a single semiconductor substrate (such as between 3-10 or more semiconductor substrates).

In some situations, a defect in the boule may be propagated during subsequent slicing (or dividing) of the boule into semiconductor substrates and further processing steps of the semiconductor substrate depending on the technique employed. For example, separating silicon carbide semiconductor substrates using process steps marketed under the tradename COLD SPLIT technology by Siltectra GmbH of Dresden Germany, involves treating the semiconductor substrate with liquid nitrogen and causing the semiconductor substrate to separate due to the rapid cooling of the semiconductor substrate. Since this technique employs contraction and expansion of the semiconductor substrate material, this may cause propagation of the cracks into the boule material and within the semiconductor substrates being formed. Similarly, other silicon carbide semiconductor substrate separation methods like the one marketed under the tradename KABRA by Disco of Tokyo, Japan may involve the use of laser combined with ultrasonic technologies in separating the individual semiconductor substrates. In such implementations, the ultrasonic vibrations may further the propagation of the cracks through the boule and/or semiconductor substrates.

Figure 1:
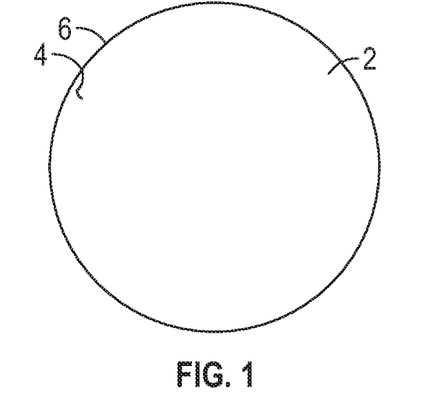
FIG. 1 is a top view of a semiconductor substrate having a crack near the edge thereof.
Figure 2:
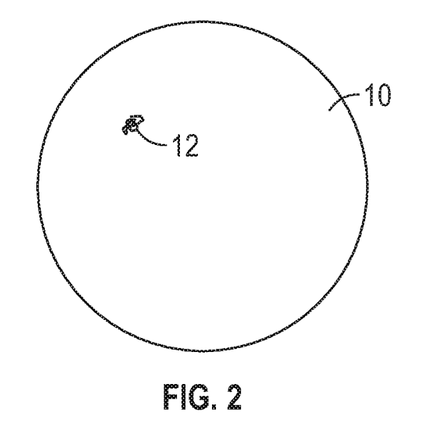
FIG. 2 is a top view of a semiconductor substrate having a localized crack therein.
Figure 3:
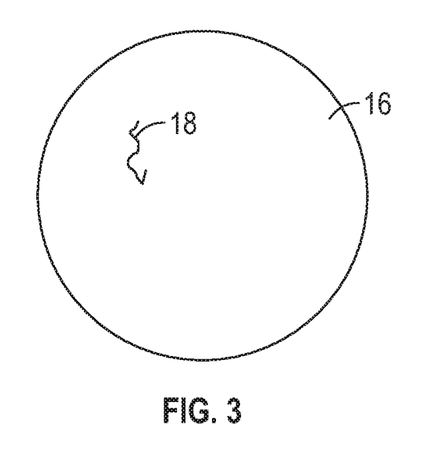
FIG. 3 is a top view of a semiconductor substrate having an extended crack therein.
Figure 4:
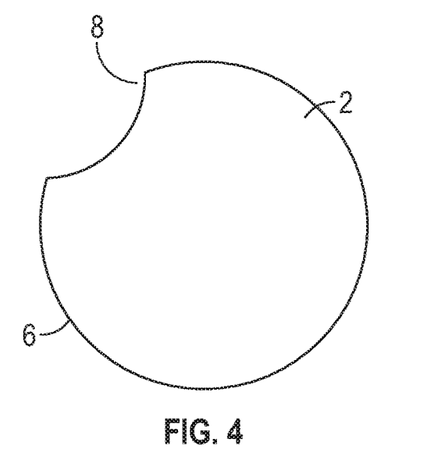
FIG. 4 is a top view of a semiconductor substrate of FIG. 1 with the cracked portion of the substrate removed.

Referring to FIGS. 1-3, different cracks in semiconductor substrates are illustrated. While internal cracking inside the boule is illustrated, it is not the most common cracking defect, which is edge cracking. Referring specifically to FIG. 1, top view of a semiconductor substrate 2 having a crack 4 near an edge 6 is illustrated. In various implementations, a method for mitigating propagation of a crack in a semiconductor substrate may include identifying the crack 4 in the semiconductor substrate 6. Identification of the crack 4 may take place before or after the semiconductor substrate 6 is singulated from a boule. The crack 4 may be identified visually with or without a microscope, through coherent diffractive imaging, including x-ray diffractive imaging, x-ray crystallography, or any other method of identification of a separation of the planes/materials/crystallographic structure of the boule indicative of a crack. Referring to FIG. 4, a top view of a semiconductor substrate of FIG. 1 with the cracked portion of the substrate removed is illustrated. In various implementations, a method for mitigating propagation of a crack in a semiconductor substrate may include removing the portion 8 of the semiconductor substrate 2 having the crack. In various implementations, this may include polishing/grinding the sidewall or edge 6 of the semiconductor substrate 2 until the crack is gone. In particular implementations, the sidewall may be polished using chemical-mechanical polishing. In other implementations, the cracked sidewall area of the die may be removed using etching, similar to the method disclosed herein in relation to FIGS. 2 and 5. By removing the portion 8 of the semiconductor substrate having the crack, the risk of propagating the crack during further processing steps of the semiconductor substrate 2 is mitigated.

In various implementations, the method for mitigating propagation of a crack in a semiconductor substrate may include marking the removed, polished, etched and/or filled area of the semiconductor substrate. In particular implementations, the die that would correspond with the removed area 8 of the semiconductor substrate may be electronically identified/marked (or electronically inked). Processing of the semiconductor substrate 2 may then be completed forming a plurality of semiconductor die from a portion of the semiconductor substrate 2 excluding the removed, polished, and/or etched portion 8 of the semiconductor substrate. In various implementations the continued processing of the substrate is done by coupling the semiconductor substrate 2 to a carrier substrate and completing the processing of the remaining semiconductor substrate 2. By coupling the semiconductor substrate 2 with the cracked portion 8 removed to a carrier substrate, most semiconductor process tools may still process the irregularly shaped semiconductor substrate 2 due to the regular dimensions of the carrier substrate. In various method implementations, the semiconductor substrate may be either removably or permanently coupled to the carrier substrate.

Figure 5:
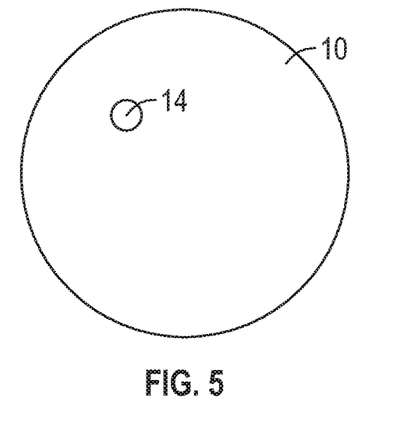
FIG. 5 is a top view of a semiconductor substrate of FIG. 2 with the cracked portion of the substrate removed.

Referring to FIG. 2, a top view of a semiconductor substrate 10 having a localized crack 12 therein is illustrated. In various implementations, a method for mitigating propagation of a crack in a semiconductor substrate may include identifying the crack 12 in the semiconductor substrate 10. The crack 12 may be identified using any method previously disclosed herein. Referring to FIG. 5, the method may include removing the portion 14 of the semiconductor substrate 10 having the crack. In various implementations, this may include etching the semiconductor substrate 10 to remove the portion 14 of the semiconductor substrate 10 including at least a portion of the crack. Either a wet etch or a dry etch may be used. By etching away at least a portion of the crack, the K stress intensity factor may be reduced (or the radius of the leading circle of the crack may be reduced) mitigating the risk of the original crack spreading. In various implementations, the method may include filling the etched area, or the removed portion 14, with a fill material following etching. The fill material may include, by non-limiting example, an epoxy, a resin, a composite, a semiconductor material, or any other fill material capable of withstanding the subsequent semiconductor processing operations to which the semiconductor substrate will be subjected. Etching and filling the cracked area of the semiconductor substrate 10 may result in mitigating propagation of the crack during further processing steps of the semiconductor substrate 10. Following repair of the semiconductor substrate, any of the techniques for handling die located near the repaired area subsequently disclosed in this document may be employed.

In various implementations, the method for mitigating propagation of a crack in a semiconductor substrate may include marking the removed, polished, etched and/or filled area of the semiconductor substrate. In particular implementations, the die that would correspond with the etched and/or filled area of the semiconductor substrate may be electronically identified and/or electronically inked. Processing of the semiconductor substrate may then be completed forming a plurality of semiconductor die from a portion of the semiconductor substrate excluding the removed, polished, etched, and/or filled portion of the semiconductor substrate. In various implementations, the method may include coupling the semiconductor substrate 10 to a carrier substrate as previously described herein. While the electronically identified portion of the semiconductor substrate cannot be used to form semiconductor die, the remaining portions of the semiconductor substrate can be salvaged as the crack was prevented from spreading and the semiconductor substrate maintained its original desired dimensions allowing it to be processed less disruptively through the semiconductor processing steps by the various process tools.

The technique of etching and filling the crack in a semiconductor substrate to prevent propagation of the crack may be employed with cracks identified on the edge of a semiconductor substrate as well.

Figure 6:
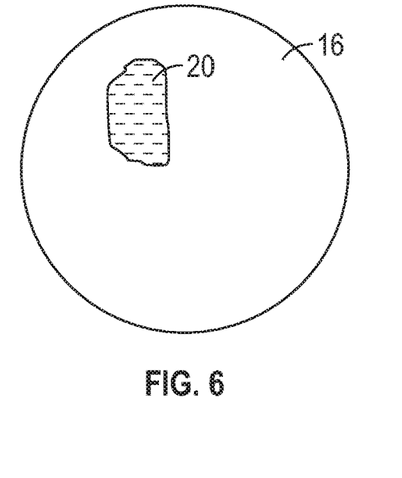
FIG. 6 is a top view of a semiconductor substrate of FIG. 3 with the cracked portion of the substrate healed.

Referring to FIG. 3, a top view of a semiconductor substrate 16 having an extended crack 18 therein is illustrated. The method for healing a crack in a semiconductor substrate may include identifying the crack 18 using any method previously disclosed herein. Referring to FIG. 6, a top view of a semiconductor substrate of FIG. 3 with the cracked portion of the substrate healed is illustrated. In various implementations, the method for healing a crack in a semiconductor substrate may include heating either the entirety of the semiconductor substrate 16 or just a localized area 20 of the semiconductor substrate 16 surrounding and including the crack. The heating may be at a controlled rate/temperature ramping profile as may the cooling of the material of the semiconductor substrate be at a controlled rate/temperature ramping profile. As used herein, the terms "heal" or "healed" refer to complete elimination of a crack or substantial elimination of a crack to the degree that a semiconductor substrate/boule can be used in subsequent fabrication processing steps. The localized area 20 of the semiconductor substrate 16 including the crack may be heated to a temperature sufficient to melt the area of the semiconductor substrate 16 immediately adjacent to the crack. As this area of the semiconductor substrate melts, the material of the semiconductor substrate 16 fills and may eliminate the crack or substantially eliminate the crack. In various implementations, the heated area of the semiconductor substrate 20 may be cooled in a controlled fashion to control the microstructure and morphology of the melted material. In particular implementations, the melted portion of the semiconductor substrate may be cooled in a specific manner to ensure as much as possible that the heated area of the semiconductor substrate recrystallizes in the same crystal orientation of the original semiconductor substrate 16. In implementations where the heat completely heals the crack and does not alter the structure or nature of the semiconductor substrate 16, the method may then include completing the processing of the entire semiconductor substrate 16 and forming a plurality of semiconductor die from the entire semiconductor substrate 16.

In other implementations, the method for healing a crack in the semiconductor may include heating the area of the crack as previously disclosed herein, however, rather than melting the material immediately adjacent to the crack and completely eliminating the crack, the area of the semiconductor substrate including the crack may be heated to an extent where the crack is not fully eliminated but it is modified to an extent where it will be less likely to propagate. In such implementations, the crack is less likely to cause the wafer to break during subsequent processing.

In various implementations, the cracked area of the semiconductor substrate may be heated by a laser. In such implementations, the laser may be used to only heat the area necessary for healing the crack, thus reducing any potential damage to the semiconductor substrate caused by the heating. In various implementations, including implementations where the semiconductor substrate is healed using a laser, the method may include electronically identifying the crack prior to heating and then only heating the electronically identified portion of the semiconductor substrate.

In various implementations, healing the semiconductor substrate through heat may permanently alter the structure of the semiconductor substrate (such as crystal planes, orientation, planarity, thickness, doping, etc.) and/or other aspects of the crystalline structure of the heated area of the structure. In such implementations, including implementations where cracking is only substantially or partially eliminated, the method includes marking or electronically identifying any die corresponding with the heated area of the semiconductor substrate. The method then includes completing the processing of the semiconductor substrate and forming a plurality of semiconductor die from those portions of the semiconductor substrate excluding the heated area of the semiconductor substrate. While the identified portion of the semiconductor substrate are thus not shipped as finished semiconductor die, because the semiconductor substrate has been reformed and the crack eliminated or sufficiently modified, the entire semiconductor substrate retains its original shape and can thus be processed with relatively little difficulty by the semiconductor process tools.

Figure 7:
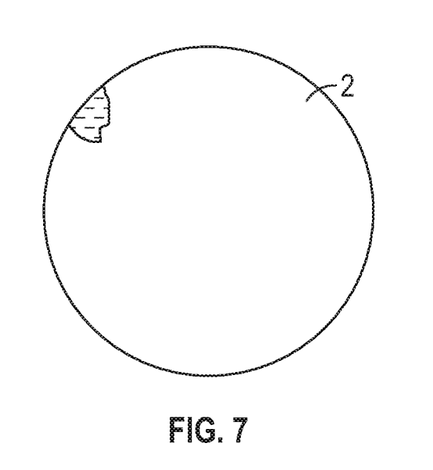
FIG. 7 is a top view of a semiconductor substrate of FIG. 1 with the cracked portion of the substrate healed.

Referring to FIG. 7, a top view of a semiconductor substrate of FIG. 1 with the cracked portion of the substrate healed is illustrated. While the method of heating to eliminate the cracking was previously demonstrated using an internal crack, the same technique can be applied to a semiconductor substrate 2 with an edge crack.

Figure 8:
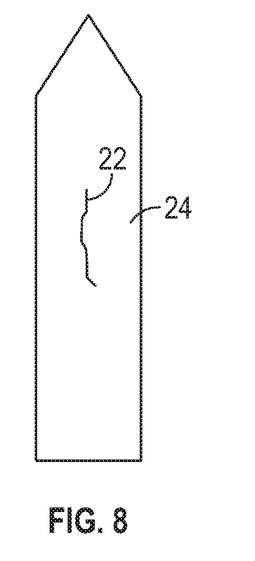
FIG. 8 is a side view of a boule having a crack therein.

Referring to FIG. 8, a side view of a boule having a crack therein is illustrated. Other method implementations involve healing or removing the crack in the boule before the semiconductor substrates are singulated from the boule. Such a method includes identifying the crack 22 in the boule 24. The existence and location of the crack in the boule may be identified visually with or without a microscope, through coherent diffractive imaging, including x-ray diffractive imaging, x-ray crystallography, or any other identification technique. In implementations where the crack is only on or near a surface of the boule, the method may include removing the sidewall of the boule 24 to an extent that removes the crack 22. Such removal may occur through, among other methods, polishing or grinding. Once the crack 22 is removed, the boule 24 may then be divided into semiconductor substrates which may then be used in the manufacture of semiconductor devices. This particular method has the disadvantage that the semiconductor substrates subsequently removed from the boule do not have the same perimeters, which may result in the need to couple the subsequent irregular semiconductor substrates to a carrier substrate for subsequent processing.

Figure 9:
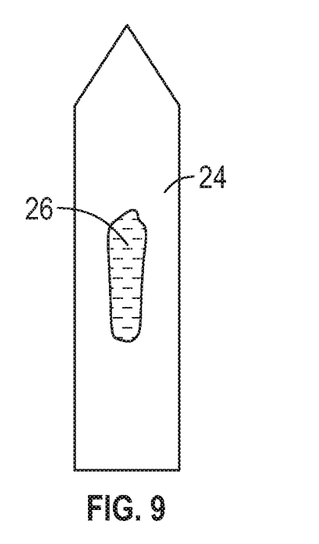
FIG. 9 is a side view of the boule of FIG. 8 with the cracked portion healed.

Referring to FIG. 9, a side view of the boule of FIG. 8 with the cracked portion healed is illustrated. In other implementations, rather than removing a portion of the boule 24, the method may include healing the crack in the boule 24 through heating the area 26 of the boule including the crack. In various implementations, the heat applied to the boule may be localized to just the cracked area 26 of the boule. In such implementations, the boule may be heated to a temperature sufficient to melt the area 26 of the boule immediately adjacent to the crack. As this area 26 of the boule melts, it may fill and eliminate the crack. In various implementations, the heated area of the boule may be cooled in a controlled manner similar to that previously discussed. In other implementations, rather than eliminating the crack the boule 24 may be heated to an extent where the crack is sufficiently modified to sufficiently reduce the risk of the crack propagating during further processing steps of the boule 24 and/or the subsequent semiconductor wafers.

In particular implementations, the melted portion of the boule may be cooled in a specific manner to ensure that the heated area of the boule forms the same crystal orientation of the original boule. In implementations where the heat completely heals the crack and does not alter the structure or nature of the boule 24, the method may then include singulating the boule into a plurality of semiconductor substrates and completing the processing of the entirety of each semiconductor substrate and forming a plurality of semiconductor die from each entire semiconductor substrate. In other implementations, healing the boule 24 through heat may irreversibly alter the structure of the boule and/or the crystalline structure of the heated area 26 of the boule. In such implementations, the method may include marking or electronically identifying all the die on each semiconductor substrate that are found within an area that corresponds with the heated area 26 of the boule 24. This electronic identifying process requires three dimensional identification and tracking of each semiconductor substrate that includes a cross section of the heated area 26 of the boule 24.

In various implementations, the cracked area of the boule may be heated by a laser. In such implementations, the laser may be able to only heat the area necessary for healing the crack, thus reducing any potential damage to the boule caused by heating. In various implementations, including implementations where the boule is healed using a laser, the method may include electronically identifying the crack prior to heating and then only heating the electronically identified portion of the boule.

In various implementations, the method includes singulating the boule 24 into a plurality of semiconductor substrates, completing the processing of the semiconductor substrates, forming a plurality of semiconductor die from portions of the semiconductor substrates and excluding the die from heated area of the semiconductor substrate for sale or other functional use. While the identified portion of the boule, and corresponding semiconductor substrates, cannot always be used to form semiconductor die, the remaining portions of the semiconductor substrate can be salvaged as the crack was eliminated or at least sufficiently modified. As with the previous semiconductor substrate-level method implementations, the process tools may have minimal difficulty handling the semiconductor substrates as the perimeters of the semiconductor substrates remain the same despite the presence of the crack or defect through the healing process.

In various implementations, a method for identifying damaged semiconductor die includes identifying a crack or damaged portion of either a boule or a semiconductor substrate. The crack or damaged portion may be identified using any method disclosed herein. The method includes electronically marking/identifying/inking the area having the crack in the boule or the semiconductor substrate. In various implementations, the method may also include electronically marking/identifying/inking a keep out zone that surrounds the area having the crack in the boule or the semiconductor substrate as well.

In various implementations, the method may include processing the boule into semiconductor substrates which may be processed into semiconductor die, or processing the semiconductor substrates into semiconductor die. In either case, the semiconductor die formed from the material from the damaged area and, in some implementations, from the keep out zone surrounding the damaged area, that are indicated in the electronically marked area of the boule or the semiconductor substrate remain electronically marked. In such implementations, the electronically marked semiconductor die may be excluded from further functional use and/or subsequent processing (such as packaging operations). This may be accomplished by using electronic wafer mapping systems which prevent the die from the electronically marked area of the wafer map for each wafer from being picked or otherwise selected for subsequent processing steps. In these implementations, the crack or damaged area need not be healed, heated, and/or removed. Such a method of identifying and marking the crack in the boule or the semiconductor substrate without healing or removing the crack may be advantageous in situations where the crack is unlikely to propagate during through further processing of the boule or the semiconductor substrate due to the nature of the semiconductor material, the characteristics of the crack, the processing to be conducted with the semiconductor substrate, or any combination thereof. In particular implementations, boules and semiconductor substrates including silicon carbide may have a mechanical strength structure sufficiently strong to avoid further propagation of the crack during further fabrication processing operations.

In places where the description above refers to particular implementations of semiconductor substrates and boules healing systems, and implementing components, sub-components, methods and sub-methods, it should be readily apparent that a number of modifications may be made without departing from the spirit thereof and that these implementations, implementing components, sub-components, methods and sub-methods may be applied to other semiconductor substrates and boules healing systems.

What is claimed is:

1. A method for healing a crack in a semiconductor substrate, the method comprising: identifying a crack in a semiconductor substrate; heating an area of the semiconductor substrate comprising the crack until the crack is healed; electronically identifying the heated area of the semiconductor substrate, the semiconductor substrate comprising one or more semiconductor die; and excluding the one or more semiconductor die formed in the heated area of the semiconductor substrate from further functional use.

2. The method of claim 1, wherein the semiconductor substrate comprises silicon carbide.

3. The method of claim 1, wherein the one or more semiconductor die are formed in at least a portion of the semiconductor substrate.

4. The method of claim 1, further comprising forming a same crystal orientation of the heated area of the semiconductor substrate as a remainder of the semiconductor substrate through one of controlled cooling, controlled heating, and controlled heating and controlled cooling of the heated area of the semiconductor substrate.

5. The method of claim 1, further comprising forming a different crystal orientation of the heated area of the semiconductor substrate as a remainder of the semiconductor substrate through one of controlled cooling, controlled heating, and controlled heating and controlled cooling of the heated area of the semiconductor substrate.

6. The method of claim 1, wherein a laser is used to heat an area of the semiconductor substrate.

7. The method of claim 1, further comprising electronically identifying the area of the semiconductor substrate comprising the crack and only heating substantially the area of the semiconductor substrate electronically identified.

8. A method for mitigating propagation of a crack in a boule, the method comprising:
identifying a crack in a boule; and
removing a portion of the boule comprising the crack prior to forming any semiconductor substrates from the boule.

9. The method of claim 8, further comprising:
forming a plurality of semiconductor substrates from the boule, one or more of the plurality of semiconductor substrates lacking a removed portion corresponding with the portion of the boule previously removed;
coupling one of the plurality of semiconductor substrates to a carrier substrate;
completing the processing of the one of the plurality of semiconductor substrates through a plurality of different semiconductor processing operations while coupled to the carrier substrate; and
forming a plurality of semiconductor die therefrom.

10. The method of claim 8, wherein the boule comprises silicon carbide.

11. The method of claim 8, wherein removing the portion of the boule comprises etching the portion of the boule.

12. The method of claim 8, wherein removing the portion of the boule comprises polishing a sidewall of the boule.

13. The method of claim 9, further comprising electronically identifying the removed portion of the one of the plurality of semiconductor substrates on a wafer map associated with the one of the plurality of semiconductor substrates and electronically excluding the removed portion of the one of the plurality of semiconductor substrates from the wafer map prior to subsequent processing.

14. A method for healing a crack in a boule, the method comprising:
identifying a crack in a boule;
heating an area of the boule comprising the crack until the crack is modified to reduce a risk of propagation of the crack to a desired level.

15. The method of claim 14, wherein the boule comprises silicon carbide.

16. The method of claim 14, further comprising electronically identifying the heated area of the boule, processing of the boule, and forming a plurality of semiconductor substrates from the boule.

17. The method of claim 16, further comprising forming a same crystal orientation of the heated area of the boule as a remainder of the boule through one of controlled cooling, controlled heating, and controlled cooling and controlled heating of the heated area of the boule.

18. The method of claim 14, further comprising forming a different crystal orientation of the heated area of the boule as a remainder of the boule through one of controlled cooling, controlled heating, and controlled heating and controlled cooling of the heated area of the boule.

19. The method of claim 14, further comprising electronically identifying the area of the boule comprising the crack and only heating the area of the boule electronically identified.

20. The method of claim 16, further comprising:
forming a plurality of semiconductor die on one of the plurality of semiconductor substrates;

electronically identifying the heated area of the one of the plurality of semiconductor substrates; and excluding one or more of the plurality of semiconductor die formed in the heated area of the one of the plurality of semiconductor substrates from further functional use.

\* \* \* \* \*